United States Patent [19]
Lin et al.

[11] Patent Number: 6,133,130
[45] Date of Patent: Oct. 17, 2000

[54] METHOD FOR FABRICATING AN EMBEDDED DYNAMIC RANDOM ACCESS MEMORY USING SELF-ALIGNED SILICIDE TECHNOLOGY

[75] Inventors: Yung-Chang Lin, Feng-Yuan; Tung-Po Chen, Taichung; Jacob Chen, Hsinchu, all of Taiwan

[73] Assignee: United Microelectronics Corp., Hsinchu, Taiwan

[21] Appl. No.: 09/181,530

[22] Filed: Oct. 28, 1998

[51] Int. Cl.[7] .................... H01L 21/3205; H01L 21/4763
[52] U.S. Cl. .................... 438/586; 438/275; 438/279; 438/655; 438/664
[58] Field of Search ...................................... 438/157, 218, 438/649, 655, 660, 663, 664, 683, 586, 241, 258, 275, 279

[56] References Cited

U.S. PATENT DOCUMENTS

| | | | |
|---|---|---|---|
| 5,897,348 | 4/1999 | Wu | 438/200 |
| 5,994,176 | 11/1999 | Wu | 438/200 |
| 6,020,240 | 2/2000 | Wu | 438/275 |
| 6,025,267 | 2/2000 | Pey et al. | 438/656 |
| 6,025,620 | 2/2000 | Kimura et al. | 257/296 |

*Primary Examiner*—Carl Whitehead, Jr.
*Assistant Examiner*—Jamie L. Davis
*Attorney, Agent, or Firm*—Thomas, Kayden, Horstemeyer & Risley

[57] ABSTRACT

A method includes a self-aligned silicide (Salicide) technology in fabrication of an embedded dynamic random access memory (DRAM). On a silicon wafer, a first MOS transistor is formed in a logic device region, and second MOS transistor is formed in a memory device region. The improved method includes forming an insulating layer over the substrate at least covering the first (second) MOS transistor. A top portion of the insulating layer is removed to expose only a top portion of the first (second) gate structure. A portion of the insulating layer covering the first MOS transistor is removed to expose the first MOS transistor. Using the remaining insulating layer on the second MOS transistor as a mask, the Salicide fabrication process is performed to form a self-aligned silicide layer on the first interchangeable source/drain region, and the exposed top surface of the first (second) polysilicon gate structure.

20 Claims, 8 Drawing Sheets

METHOD FOR FABRICATING AN EMBEDDED DYNAMIC RANDOM ACCESS MEMORY USING SELF-ALIGNED SILICIDE TECHNOLOGY

BACKGROUND OF THE INVENTION

1. Field of the Invention

This invention relates to semiconductor fabrication, and more particularly to including a self-aligned silicide (Salicide) technology in fabrication of an embedded dynamic random access memory (DRAM).

2. Description of Related Art

Conventionally, an electronic device includes a logic circuit device and a memory device, which are separately fabricated in different individual semiconductor substrates. As the technologies of semiconductor fabrication are further developed, a new trend has developed in which the logic circuit device and the memory device are fabricated in a single substrate so as to enhance the operation speed. This kind of device layout is called an embedded DRAM, in which the DRAM is fabricated together with the logic circuit device in a substrate.

However, the fabrication processes for the logic device and the memory device are different. The logic device mainly used for a logic operation needs a fast data transmission speed, and therefore needs a self-aligned silicide (Salicide), such as titanium silicide, formed over the interchangeable source/drain regions to reduce sheet resistance. The memory device mainly used for storing information data needs to avoid leakage current, which leakage current may cause a change of data, and so the interchangeable source/drain regions must not have silicide.

Figure 1A:
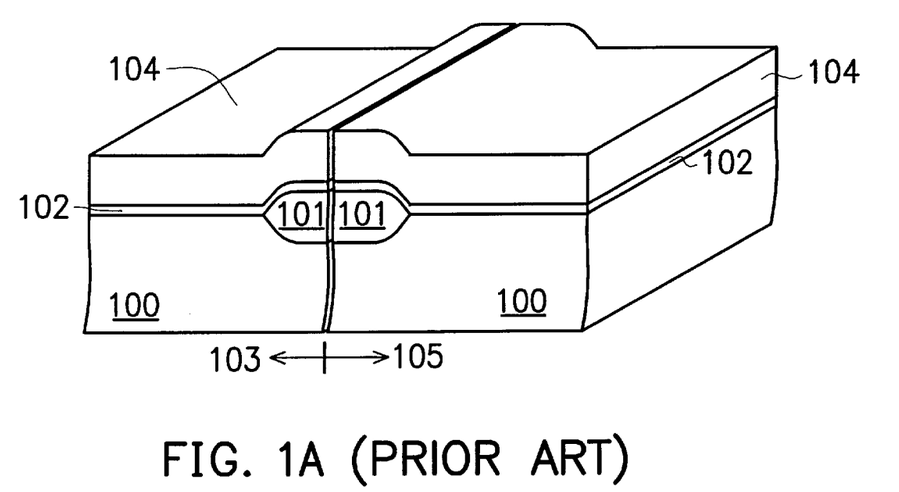
FIGS. 1A–1E are perspective/cross-sectional views or cross-sectional views schematically illustrating a conventional fabrication process of an embedded DRAM.

FIGS. 1A–1E are perspective/cross-sectional views schematically illustrating a conventional fabrication process of an embedded DRAM. FIGS. 1F–1H are the cross-sectional views continuing from FIG. 1E. In FIG. 1A, a semiconductor substrate 100, such as a silicon substrate, is provided. The substrate 100 is divided into a logic device region 103 and a memory device region 105 by an isolating field oxide layer 101. An oxide layer 102 is formed over the substrate 100. An undoped polysilicon layer 104 is then formed over the substrate 100. A complementary metal-oxide semiconductor (CMOS) fabrication process is to be performed so as to form a P-type metal-oxide semi-conductor (MOS) transistor, that is, a PMOS transistor and an N-type MOS (NMOS) transistor. The fabrication process tarts from formation of a dual gate.

Figure 1B:
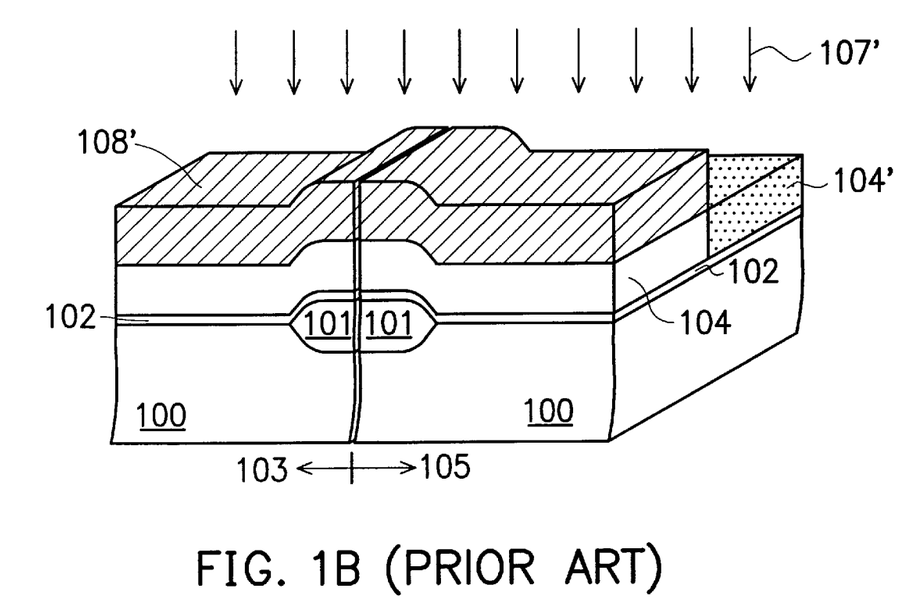

In FIG. 1B, a masking layer 108' is formed over the undoped polysilicon layer 104 so that a portion remains exposed. The exposed portion of the polysilicon layer 104 is doped by an N$^+$-type dopant 107' and results in a doped polysilicon layer 104'. The N$^+$-type polysilicon layer 104' is used for forming the NMOS transistor.

Figure 1C:
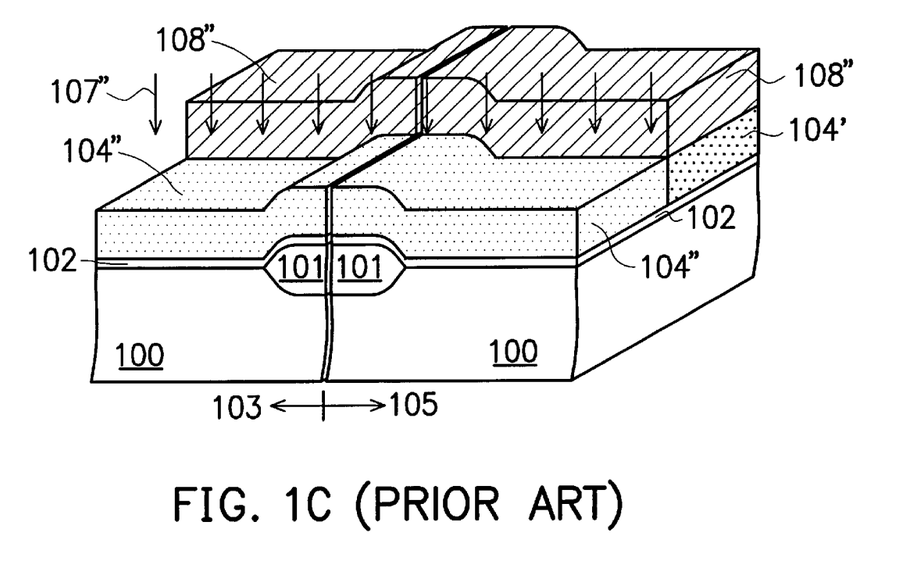

In FIG. 1C, after removing the masking layer 108', a masking layer 108" is formed to cover the N$^+$-type polysilicon layer 104'. A P$^+$-type dopant 107" is doped into the undoped polysilicon layer 104 of FIG. 1B so that a P$^+$-type polysilicon layer 104" is formed over the substrate 100. The P$^+$-type polysilicon layer 104" is used for forming the PMOS transistor. The N$^+$-type polysilicon layer 104' and the P$^+$-type polysilicon layer 104" abutting each other late form a dual gate structure.

Figure 1D:
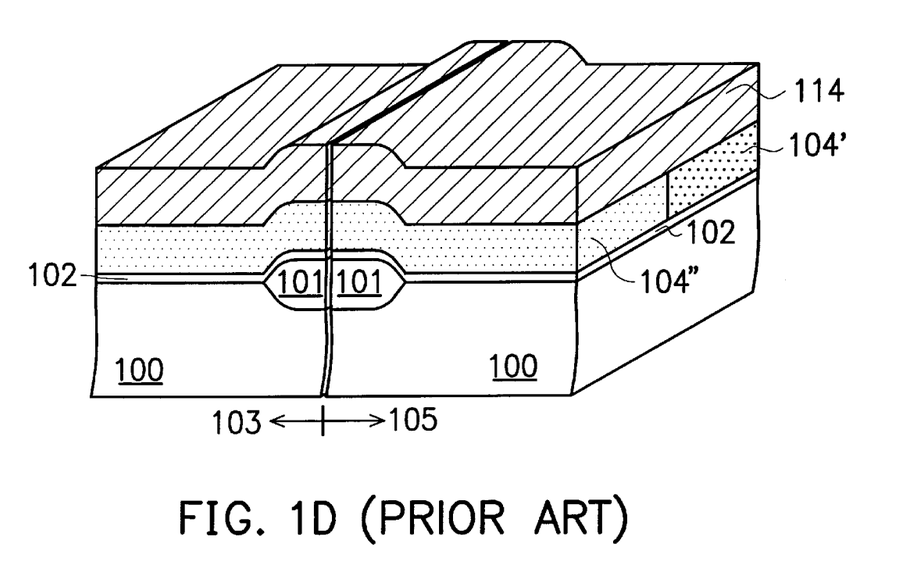

In FIG. 1D, in order to increase the data transmission speed, a polycide layer 114 is formed over the substrate to cover the N$^+$-type polysilicon layer 104' and the P$^+$-type polysilicon layer 104".

Figure 1E:
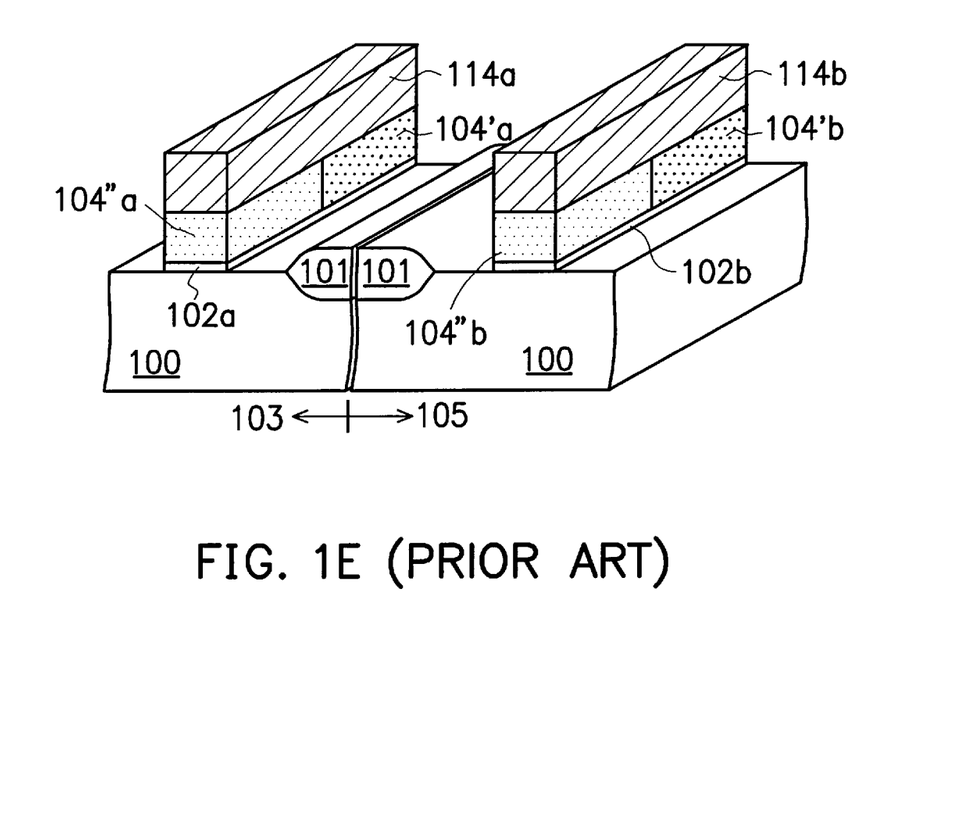
Figure 1F:
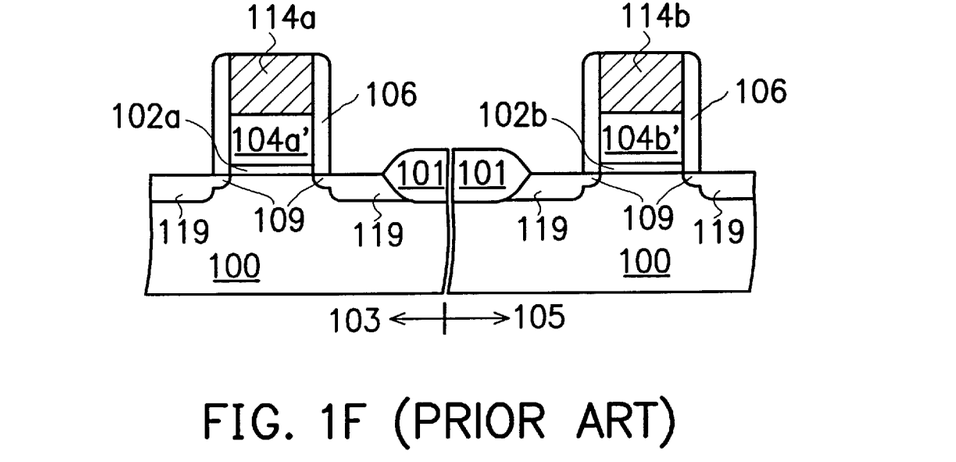
FIGS. 1F–1H are the cross-sectional views continuing form FIG. 1E.
Figure 1G:
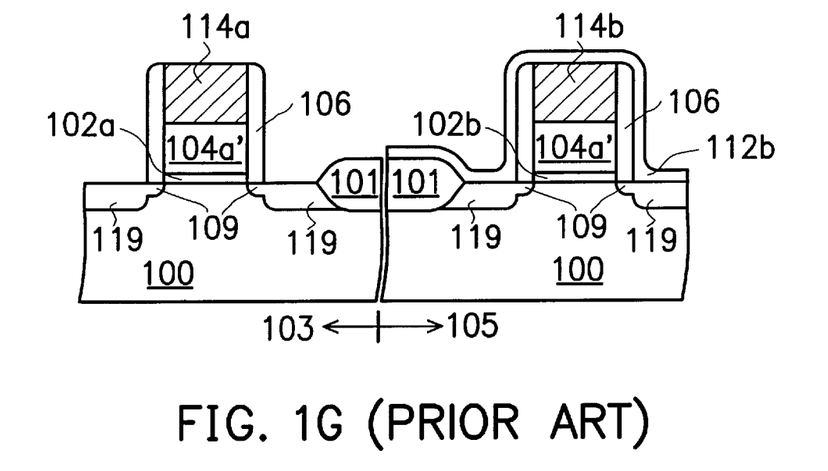
Figure 1H:
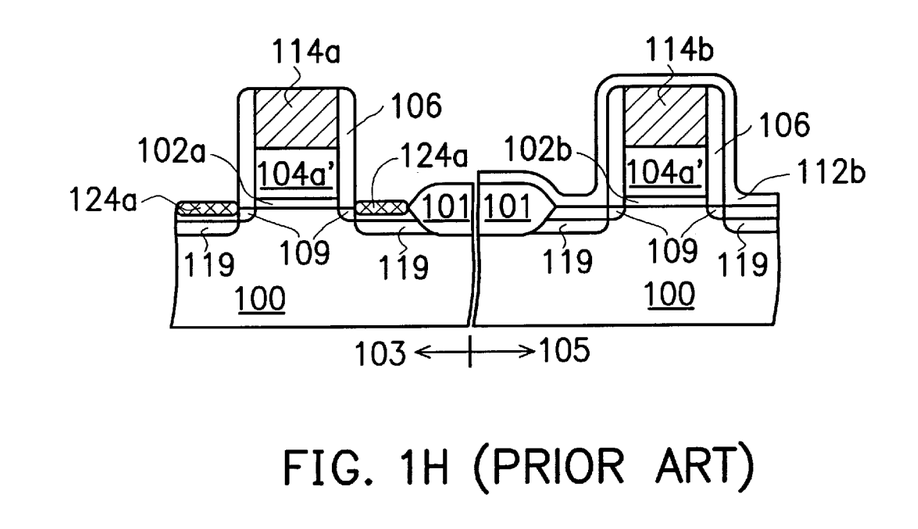

In FIG. 1E, the polycide layer 114, the N$^+$-type polysilicon layer 104', the P$^+$-type polysilicon layer 104" and the pad oxide 102 are patterned to form two separate dual gate structures, one in the logic device region 103 and one in the memory device region 105. In the logic device region 103, the dual gate includes an oxide layer 102a, an N$^+$-type polysilicon layer 104a', a P$^+$-type polysilicon layer 104a", and a polycide layer 114a. Similarly, the dual gate structure in the memory device region 105 includes an oxide layer 102b, and N$^+$-type polysilicon layer 104b', a P$^+$-type polysilicon layer 104b", and a polycide layer 114b.

In this conventional process, the polycide layer 114 is not easily etched.

In FIG. 1F, using the dual gate structures and the isolation structure 101 as a mask, an ion implantation process is performed to lightly dope the silicon substrate 100 so as to form an interchangeable source/drain region with a lightly doped drain (LDD) structure. It is formed through following processes. A lightly doped region is formed on each side of the dual gate structures. A spacer 106 serving as a doping mask is formed on each sidewall of the dual gate structures. Then, a heavily doped region is formed by heavily doping the lightly doped region. After a rapid thermal process (RTP) to ensure a uniform distribution of the doped dopants, the interchangeable source/drain region with LDD structure is formed. The LDD structure includes a lightly doped region 109 under the spacer 106 with shallower doping depth and a heavily doped region 119 with greater doping depth.

In the above descriptions, rapid thermal process is used to form the interchangeable source/drain region of 109 and 119. This rapid thermal process causes an inter-layer diffusion at the interface between the N$^+$-type polysilicon layer 104a' and the P$^+$-type polysilicon layer 104a" through the polycide layer 114a. Similarly, an inter-layer diffusion also occurs at the interface between the P$^+$-type polysilicon layer 104b' and the P$^+$-type polysilicon layer 104b" through the polycide layer 114b. Moreover, the polycide layers 114a, 114b have poor thermal stability. For example, when RTP is performed, grains agglomerate in what is called a grain agglomerate phenomenon, which causes the polycide layer 114a, 114b, or any other kind of silicide layer, to easily crack. Such a crack deteriorates conductivity.

In FIG. 1G, an oxide layer 112b is formed only over the memory device region 105 to protect all metal-oxide semiconductor (MOS) transistors formed in the memory device region 105. In FIG. 1H, a self-aligned titanium silicide layer 124a is formed on the interchangeable source/drain region 119 in the logic device region 103.

The rest of the fabrication processes to form the embedded DRAM should be well known by one skilled in the art, and are not described here.

In summarization of the above descriptions, the conventional method for fabricating the embedded DRAM has some problems. Since the interchangeable source/drain region 119 in the memory device region 105 cannot have a silicide layer like the self-aligned silicide layer 124a in the logic device region 103, in order to reduce its resistance, the polysilicon layer is used for this purpose. On the contrary, it is desirable to form the self-aligned silicide layer 124a on the interchangeable source/drain region 119 in the logic device region 103. Thus, it is necessary to form the oxide layer 112b over the memory device region 105 before forming the self-aligned silicide layer 124a. This increases complexity of the fabrication process. Moreover, the polycide layer 114 is not easily etched. The polycide layer 114 also causes inter-layer diffusion at the interface between the N+-type polysilicon layer 104a' and the P+-type polysilicon layer 104a", and the interface between the N+-type polysilicon layer 104b' and the P+-type polysilicon layer 104b". Furthermore, the polycide layer 114 has poor thermal stability, which causes it to crack, and results in an increase of resistance.

SUMMARY OF THE INVENTION

It is therefore an objective of the present invention to provide a method for fabricating an embedded DRAM including a self-aligned silicide fabrication process so as to avoid the problems induced by the thermal instability of the polycide.

It is another an objective of the present invention to provide a method for fabricating an embedded DRAM including a self-aligned silicide fabrication process so as to avoid an inter-layer diffusion at the interface between two different doped-type regions in a dual gate structure.

In accordance with the foregoing and other objectives of the present invention, an improved method for fabricating an embedded DRAM including a novel self-aligned silicide (Salicide) fabrication process is provided. The improved method is, for example, suitable for a semiconductor substrate that includes a first MOS transistor and a second MOS transistor. The first MOS transistor and the second MOS transistor are respectively located in a logic device region and a memory device region in the embedded DRAM. The first (second) MOS transistor includes a first (second) gate structure, a first (second) spacer on each sidewall of the first (second) gate structure, and a first (second) LDD interchangeable source/drain region. The first (second) gate structure includes, for example, polysilicon with two different doped-type regions so that the first (second) is a dual gate structure.

The improved method includes forming an insulating layer over the substrate such that the insulating layer covers both the first and second MOS transistors. A top portion of the insulating layer is removed to expose the top portion of the first and the second gate structure. A portion of the insulating layer covering the first MOS transistor is removed to expose the first MOS transistor. Using the remaining insulating layer on the second MOS transistor as a mask, the Salicide fabrication process is performed to form a self-aligned silicide layer on the first interchangeable source/drain region, and the exposed top surface of the first and the second polysilicon gate structures.

In conclusion, the invention includes no polycide on the first and the second gate structures, on which a polycide layer is conventionally formed, so that there is no problem induced by polycide. Instead, the invention simultaneously forms the self-aligned silicide layer on the first and the second gate structures to increase the conductivity of the gate structures. Therefore, the fabrication process is simplified. The inter-layer diffusion at the interface between two different doped-type regions in the gate structure is effectively avoided because the Salicide layer is formed after the interchangeable source/drain region is formed. An agglomeration of the Salicide layer due to thermal budget also does not occur since it is formed after a rapid thermal process for annealing of the interchangeable source/drain region.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

FIGS. 1A–2D are perspective views or cross-sectional views schematically illustrating a fabrication process of an embedded DRAM according to a preferred embodiment of the invention. In FIG. 2A, a semiconductor substrate 200, such as a silicon substrate, is provided. The substrate 200 is divided into a logic device region 203 and a memory device region 205 by an isolation structure 201, such as a local oxide oxidation (LOCOS) structure or a shallow trench isolation (STI) structure. An oxide layer 202 is formed over the substrate 200. An undoped polysilicon layer 204 is formed over the substrate 200. A complementary metal-oxide semiconductor (CMOS) fabrication process is, for example, to be performed so as to form a P-type metal-oxide semiconductor (MOS) transistor, that is, PMOS transistor and an N-type MOS (NMOS) transistor. The fabrication process may, for example, start from formation of a dual gate.

Figure 2A:
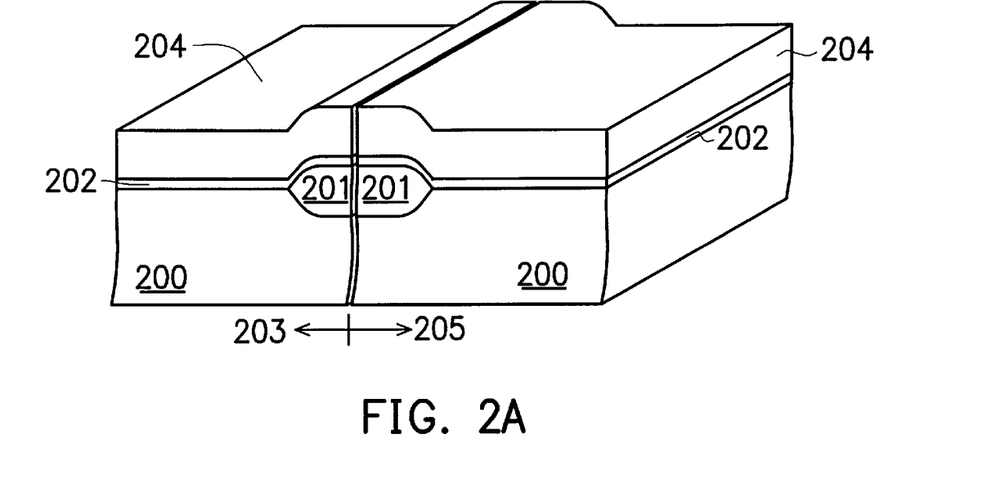
FIGS. 2A–2D are perspective/cross-sectional views schematically illustrating a fabrication process of an embedded DRAM according to a preferred embodiment of the invention.
Figure 2B:
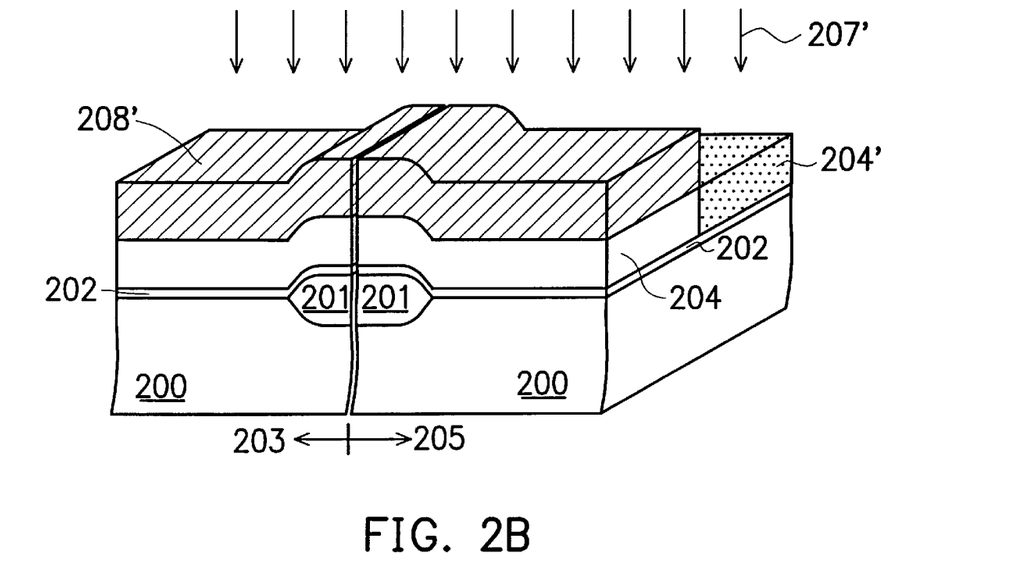

In FIG. 2B, a masking layer 208' is, for example, formed over the undoped polysilicon layer 204 of FIG. 2A so that a portion remains exposed. The expose portion of the polysilicon layer 204 is doped by, for example, an N+-type dopant 207' and results in a doped polysilicon layer 204'. The doping process includes, for example, an ion implantation process. The N+-type polysilicon layer 204' is used for forming the NMOS transistor.

Figure 2C:
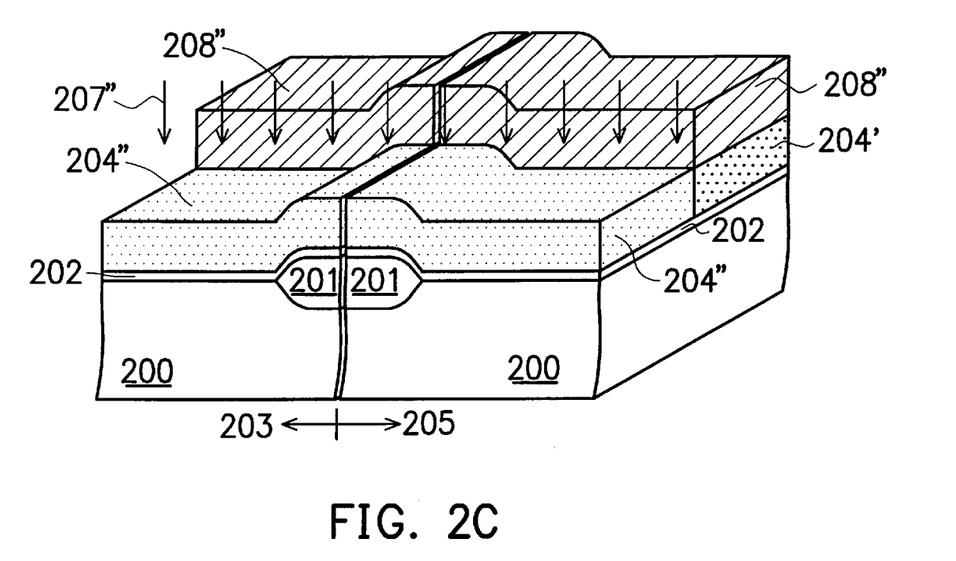

In FIG. 2C, the masking layer 108' is removed. A masking layer 208" is formed to cover the N+-type polysilicon layer 204'. A P+-type dopant 207" is doped into the undoped polysilicon layer 204 of FIG. 2B so that a P+-type polysilicon layer 204" is formed over the substrate 200. The doping process includes, for example, an ion implantation process. The P+-type polysilicon layer 204" is used for forming the PMOS transistor. The N+-type polysilicon layer 204' and the P+-type polysilicon layer 204" abutting each other later form a dual gate structure. The dual gate structure can be also formed by firstly forming the P+-type polysilicon layer 204" and secondly forming the N+-type polysilicon layer 204'.

Figure 2D:
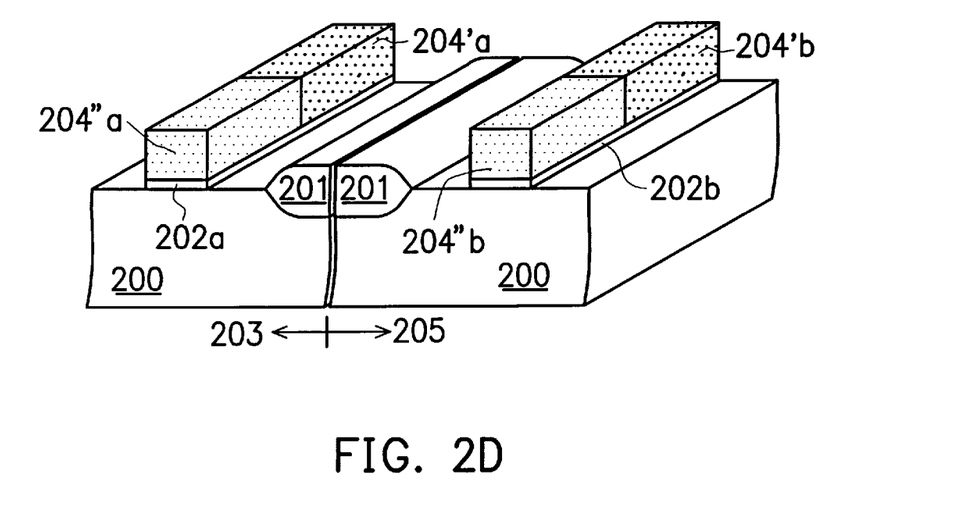

In FIG. 2D, the N+-type polysilicon layer 204', the P+-type polysilicon layer 204', and the pad oxide 202 are patterned to form a first dual gate structure in the logic region 203 and a second dual gate structure in the memory device region 205. A portion of the substrate 200 is exposed serving as an area for forming the desired interchangeable source/drain region. In the logic device region 203, the first dual gate structure includes an oxide layer 202a, and N+-type polysilicon layer 204a', and a P+-type polysilicon layer 204a'. Similarly, the second dual gate in the memory device region 205 includes an oxide layer 202b, and N+-type polysilicon layer 204b', and a P+-type polysilicon layer 204b". There is no polycide included in the structure shown in FIG. 2D, which is different from the conventional one shown in FIG. 1E by the polycide layers 114a, 114b.

Since the invention does not include the polycide layers 114a, 114b of FIG. 1E, this gives several advantages to subsequent thermal processes. The advantages are, for example, an avoidance of cracks in the polycide layers 114a, 114b due to thermal instability, and a subsequent problem of inter-layer diffusion.

Figure 2E:
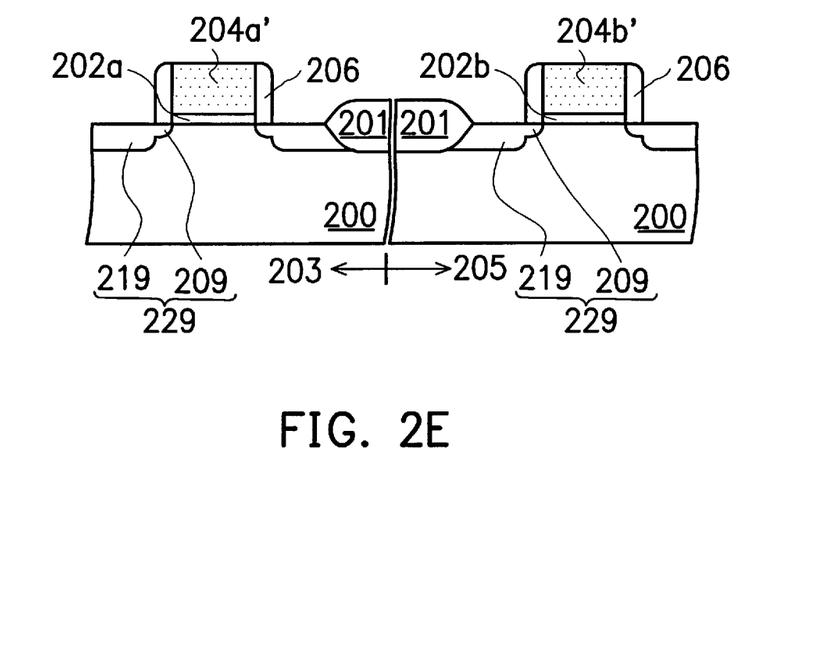
FIGS. 2E–2H are the cross-sectional views continuing from FIG. 2D according to the preferred embodiment of the invention.

FIGS. 2E–2H are the cross-sectional views continuing from FIG. 2D according to the preferred embodiment of the invention. In FIG. 2E, using the dual gate structures and the isolation structure 201 as a mask, a doping process, such as an ion implantation process, is performed to lightly dope the exposed substrate 200. A spacer 206 is formed on each side of the dual gate structures. The formation of the spacer 206 includes depositing an oxide layer (not shown) over the substrate 200 and performing an etching back process to remove the oxide layer. The remaining oxide layer on each sidewall of the dual gate structures forms the spacers 206. Using the spacers 206, the isolation structure 201, and the dual gate structures, a heavy doping process, such as a heavy ion implantation process, is performed to dope the exposed substrate 200. After a thermal process, such as a rapid thermal process (RTP), is performed to drive in dopants, such as implanted ions, an interchangeable source/drain region 229 on each side of the dual gate structures in the substrate 200 is formed. The interchangeable source/drain region 229 therefore has a lightly doped drain (LDD) structure that includes a lightly doped region 209 below the spacer 206 with shallower depth and a heavily doped region 219 with greater depth in the exposed region of the substrate 200. A first MOS transistor using the first dual gate structure as its gate is formed in the logic device region 203, and a second MOS transistor using the second dual gate structure as its gate is formed in the memory device region 205. The first (second) MOS transistor at least includes, for example, a PMOS and a NMOS transistor depending on the $N^+$-type polysilicon layers 204a', 204b' and the $P^+$-type polysilicon layers 204a'', 204b''.

Figure 2F:
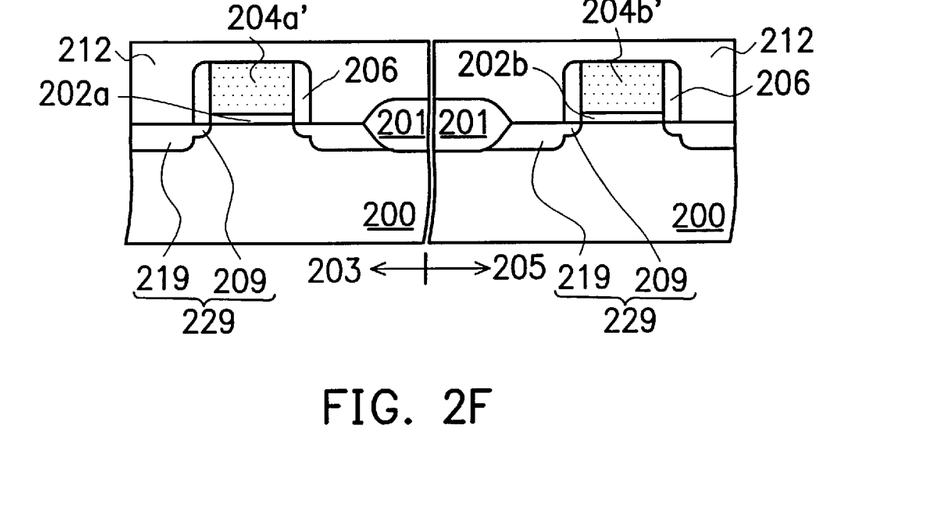

In FIG. 2F, an insulating layer 212 including, for example, oxide is formed over the substrate 200 through, for example, chemical vapor deposition (CVD) in order to at least cover the first and the second MOS transistors. A planarization process on the insulating layer is preferably included. The planarization process includes, for example, chemical mechanical polishing (CMP).

Figure 2G:
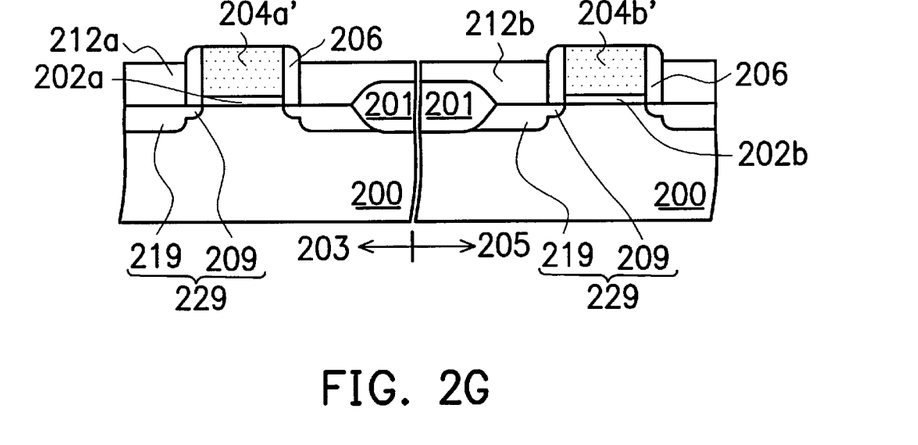

In FIG. 2G, an etching back process is performed to remove a top portion of the insulating layer 212 of FIG. 2F so as to exposed a top portion of the dual gate structure. The spacer 206 may also be exposed with the top portion. The insulating layer 212 becomes an insulating layer 212a in the logic device region 203, and an insulating layer 212b in the memory device region 205.

Figure 2H:
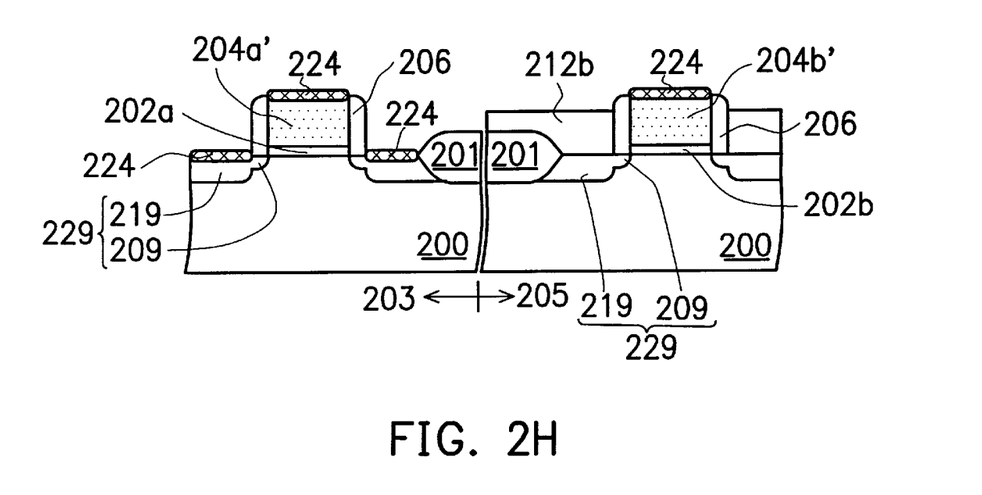

In FIG. 2H, the insulating layer 212a is further removed by, for example, photolithography and etching so as to expose the first MOS transistor, which is one element of the logic device. In order to have fast data transmission speed, the interchangeable source/drain region 229 of the first MOS transistor needs Salicide to achieve this purpose. In addition, both the first and the second dual gate structures also need Salicide. A Salicide fabrication process is performed to form a Salicide layer 224 on the inter-changeable source/drain region 229 of the first MOS transistor and both the dual gate structure. Since the insulating layer 212b covers the interchangeable source/drain region 229 of the second MOS transistor in the memory device region 205, it has no Salicide on it so that the second MOS transistor can serve as memory element in the memory device. The Salicide fabrication process includes, for example, depositing a metal layer including titanium, cobalt or other materials with similar property over the substrate 200, performing a thermal process to form the Salicide layer 224 through reaction, and removing the remaining metal layer. The metal layer also preferably includes titanium nitride or cobalt nitride respectively over the titanium or cobalt. The thermal process preferably includes RTP.

At this stage, the first MOS transistor and the second transistor used in the embedded DRAM with the improved structure is formed. The rest of the fabrication processes for the embedded DRAM are well known by one skilled in the art and are not further described here. The Salicide layer 224 is formed after the formation of interchangeable source/drain region 229, which includes a thermal process, so that a dopant inter-layer diffusion phenomenon at the interfaces does not occur. The interfaces are located between the $N^+$-type polysilicon layer 204a' and the $P^+$-type polysilicon layer 204a'', or between the $N^+$-type polysilicon layer 204b' and the $P^+$-type polysilicon layer 204b''. Moreover, since there is no polycide included, it is not necessary to worry about a crack of the polycide layers 114a, 114b shown in FIG. 1E due to thermal instability of polycide.

In conclusion, the invention has several characteristics as follows:

1. The invention includes no formation of the polycide layers 114a, 114b on the dual gate structures. Instead, a Salicide layer 224 is simultaneously formed on both the dual gate structures and the interchangeable source/drain region 229 of the first transistor. Therefore, the fabrication process is simplified and the required conductivity is maintained.

2. The Salicide layer 224 is formed after the formation of interchangeable source/drain region 229, which includes a thermal process, so that a dopant inter-layer diffusion phenomenon at the interfaces does not occur.

3. Since the invention includes no formation of the polycide layers 114a, 114b, it is not necessary to worry about a crack of the polycide layers 114a, 114b due to thermal instability of polycide.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating an embedded dynamic random access memory (DRAM) with a self-aligned silicide technology, in which the embedded DRAM is fabricated on a silicon substrate having a first metal-oxide semiconductor (MOS) transistor in a logic device region and a second MOS transistor in a memory device region, and the logic device region and the memory device region are separated by an isolation structure, wherein each of the MOS transistors has a gate including polysilicon and an interchangeable source/drain region on each side of the gate in the substrate, the method comprising:

forming an insulating layer on the interchangeable source/drain regions of the second MOS transistor; and     forming a self-aligned silicide (Salicide) layer over the exposed substrate at least on the exposed gates of the first and second MOS transistors and the interchangeable source/drain regions of the first MOS transistor.

2. The method of claim 1, wherein the first MOS transistor comprises a $P^+$-type MOS transistor and an $N^+$-type MOS transistor, which abut each other.

3. The method of claim 1, wherein the second MOS transistor comprises a P$^+$-type MOS transistor and an N$^+$-type MOS transistor, which abut each other.

4. The method of claim 1, wherein the step of forming the insulating layer on the interchangeable source/drain regions of the second MOS transistor further comprises:

forming a primary insulating layer over the substrate, at least covering the first MOS transistor and the second MOS transistor;

removing a top portion of the primary insulating layer to expose a top portion of both the gates of the first and the second MOS transistors; and removing a portion of the primary insulating layer on the first MOS transistor to expose the first MOS transistor.

5. The method of claim 4, wherein the insulating layer comprises oxide.

6. The method of claim 4, wherein the step of forming the primary insulating layer over the substrate comprises a chemical vapor deposition (CVD).

7. The method of claim 4, wherein the step of removing a top portion of the primary insulating layer over the substrate comprises a planarization process.

8. The method of claim 7, wherein the planarization process comprises a chemical mechanical polishing (CMP) process.

9. The method of claim 1, wherein the step of forming the Salicide layer further comprises:

forming a metal layer over the substrate at least covering the first MOS transistor and the second MOS transistor;

performing a thermal process to form the Salicide layer through reaction at the interface between the metal layer and the substrate, which comprises silicon; and removing the remaining metal layer.

10. The method of claim 9, wherein the metal layer comprises titanium.

11. The method of claim 9, wherein the metal layer comprises titanium and titanium nitride.

12. The method of claim 9, wherein the Salicide layer comprises titanium Salicide.

13. The method of claim 9, wherein the metal layer comprises cobalt.

14. The method of claim 9, wherein the metal layer comprises cobalt and cobalt nitride.

15. The method of claim 9, wherein the Salicide layer comprises cobalt Salicide.

16. The method of claim 9, wherein the thermal process comprises a rapid thermal process (RTP).

17. The method of claim 1, wherein the gates of the first and the second MOS transistors comprises a dual gate structure.

18. The method of claim 1, wherein each of the interchangeable source/drain regions of each of the first MOS transistors and the second MOS transistors comprises a lightly doped drain (LDD) structure.

19. A method for fabricating an embedded dynamic random access memory (DRAM) on a semiconductor substrate having a logic device region and a memory device region, which are separated by an isolation structure, the method comprising:

forming a first metal-oxide semiconductor (MOS) transistor in the logic device region and a second MOS transistor in the memory device region, wherein each of the first and the second MOS transistors comprises a gate and an interchangeable source/drain region on each side of the gate;

forming an insulating layer over the substrate;

removing a top portion of the insulating layer to expose both the gates of the first and the second MOS transistors;

removing a portion of the insulating layer to expose the interchangeable source/drain region of the first MOS transistor so that the interchangeable source/drain regions of the second MOS transistor are still covered by the insulating layer; and forming a self-aligned silicide layer over the first and the second MOS transistors through a thermal process so that the self-aligned silicide layer forms on the gate and the interchangeable source/drain regions of the first MOS transistor and only on the gate of the second MOS transistor.

20. The method of claim 19, wherein the self-aligned silicide layer comprises titanium silicide.

* * * * *